United States Patent
Zampini et al.

(12)

(10) Patent No.: US 6,200,479 B1
(45) Date of Patent: *Mar. 13, 2001

(54) PHENOLIC RESIN PURIFICATION

(75) Inventors: Anthony Zampini, Westborough; Harold F. Sandford, Groton, both of MA (US)

(73) Assignee: Shipley Company, L.L.C., Marlborough, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/783,211

(22) Filed: Jan. 14, 1997

(51) Int. Cl.⁷ .................................................. B01D 15/04
(52) U.S. Cl. .......................... 210/660; 210/661; 210/681; 210/683; 528/158; 528/160
(58) Field of Search ..................... 528/160, 158; 210/660, 661, 681, 683

(56) References Cited

U.S. PATENT DOCUMENTS

| 4,963,463 | * | 10/1990 | Koshiba et al. ........................ 430/191 |
| 5,443,736 | | 8/1995 | Szmanda et al. . |
| 5,472,616 | | 12/1995 | Szmanda et al. . |
| 5,500,127 | | 3/1996 | Carey et al. . |
| 5,518,628 | * | 5/1996 | Carey ...................................... 210/686 |
| 5,525,315 | | 6/1996 | Burke . |
| 5,529,880 | * | 6/1996 | Zampini et al. ........................ 430/190 |
| 5,541,263 | * | 7/1996 | Thackeray et al. ................. 525/328.8 |
| 5,571,657 | | 11/1996 | Szmanda et al. . |
| 5,739,265 | * | 4/1998 | Rahman et al. ........................ 528/482 |

FOREIGN PATENT DOCUMENTS

93/12152    6/1993   (WO) .

OTHER PUBLICATIONS

Hitachi, WPIDS AN 89–312247, abstracting JP01228560, Sep. 1989.*
Schirmer, Translation of DE 4100473, Jul. 1992.*

* cited by examiner

*Primary Examiner*—Jeffrey C. Mullis
(74) *Attorney, Agent, or Firm*—Peter F. Corless; Darryl P. Frickey; Edwards & Angell, LLP

(57) ABSTRACT

The invention is for a process of removing acid salt contaminants from a resin solution. The process comprises providing an organic solution of a phenolic resin having a portion of its phenolic hydroxyl groups condensed with an acid halide in the presence of a base catalyst. The organic solutions is then contacted with a strong acid cation exchange resin and a base anion exchange resin for a time sufficient to remove essentially all of said acid salt contaminants. Acid salt contamination is reduced to a level below normal detection limits.

22 Claims, No Drawings

PHENOLIC RESIN PURIFICATION

BACKGROUND OF THE INVENTION

1. Introduction

This invention relates to the purification of phenolic resins having entrapped acid residues. In a preferred embodiment, this invention relates to the purification of phenolic resins having phenolic hydroxyl groups condensed with an acid halide. The purification process comprises treatment with a mixed acid and base ion exchange resin to remove acid salt contaminants.

2. Description of the Prior Art

Phenolic resins such as novolak resins and polyvinyl phenol resins are known and used as binders for many coating compositions. A major use of such resins is for the formulation of photoresist compositions. Novolak resins are disclosed as photoresist binders generally in U.S. Pat. No. 4,404,272. Polyvinyl phenol resins are disclosed as photoresist binders in U.S. Pat. No. 3,869,292.

The formation of phenolic novolak resins by condensation of a phenol with an aldehyde is well known in the art and described in numerous publications including the *Kirk Othmer Encyclopedia of Chemical Technology*, Volume 15, pages 176 to 208, 1968, incorporated herein by reference. Phenol itself is the phenol used in the greatest volume for the formation of such phenolic resins, but resorcinol, alkyl substituted phenols such as cresols, xylenols, and p-tert-butylphenol and p-phenylphenol are used in substantial volume. In the past, the aldehyde used has been almost exclusively formaldehyde, but small amounts of acetaldehyde and furfuraldehyde have also been used. The condensation of a phenol with an aldehyde is typically an acid catalyzed reaction, often an oxalic acid catalyzed reaction, with a molar ratio of aldehyde to phenol less than 1.

Early novolak resins used for photoresist manufacture have been modified for specific purposes. For example, prior to cure, novolaks of a phenol and formaldehyde have moderate thermal stability and typically melt within a range of from about 90° C. to 120° C., dependent upon the composition of the resin and its molecular weight. Recent developments have created novolak resins with increased melt temperature. For example, as disclosed in U.S. Pat. No. 4,424,315, an effort to increase thermal stability of novolak resins comprised acid condensation of a mixture of a naphtha and a phenol with an aldehyde. The resins so produced are copolymers formed by acid condensation of an aldehyde with an aromatic alcohol mixture of a naphtha and a phenol in the presence of an acid catalyst. These resins exhibit improved resistance to flow at elevated temperatures, though it was found that photoresists formulated with such resins were difficult to develop. In U.S. Pat. No. 4,943,511, a positive photoresist composition is disclosed which uses a resin binder that is prepared from a phenolic component having a high p-cresol content and an aldehyde that is a mixture of formaldehyde and an aromatic aldehyde. In accordance with the patent, photoresists formulated using the resin possess improved resolution capabilities, but it is believed that the resin exhibits only minimal thermal improvement. U.S. Pat. No. 5,216,111 is directed to resins comprising the condensation product of a phenol and an aromatic aldehyde and mixtures of such resins with other phenolic resins including conventional novolak resins. The resins disclosed in the patent exhibit glass transition temperatures in excess of 125° C. and many exhibit glass transition temperatures as high as 175° C. or higher. An alternative approach to the formation of aromatic novolak resins is disclosed in U.S. Pat. No. 5,238,776 where the resin is the product resulting from the acid condensation of a bishydroxymethyl phenol with another phenol in the absence of an aldehyde. By the process of this patent, high molecular weight resins are formed having excellent thermal stability.

In addition to modification of the structure of a phenolic resin as described above, it is also known that the phenolic resins may be modified by substitution of various groups onto pendant phenolic hydroxyl groups of the resin. For example, U.S. Pat. Nos. 4,968,581; 4,883,740; 4,810,613; 4,491,628 and 5,362,600 disclose substitution of certain acid labile blocking groups on the resin by esterification of an acid halide with the pendant hydroxyl groups. Exposure of a photoresist having a pendant acid labile group in a procedure that generates an acid cleaves the acid labile blocking group whereby exposure is reported to create areas of different solubility characteristics between exposed and unexposed areas of the polymer. Upon selective cleavage of the blocking group through exposure of the photoresist, a polar functional group is said to be provided, for example, carboxyl or imide.

An alternative reason for reaction of a phenolic resin with an acid halide is to modulate solubility or developability of an exposed resist coating. In this procedure, inert groups are condensed onto the phenolic hydroxyl group to decrease the solubility of the resin in a developer. Alkyl sulfonates and acid halides have been used for this purpose. In U.S. Pat. No. 5,541,263, phenolic resin having pendant phenolic hydroxyl groups are reacted with an acid halide to form an inert blocking group. By reaction of a portion, but not all of the hydroxyl groups, the solubility of a photoresist formulated with the blocked phenolic resin is decreased. It was reported that this decrease reduced or prevented microbridging during development.

A further modification of phenolic resins comprises reaction of pendant phenolic groups of the resin with radiation sensitive naphthoquinone diazide sulfonyl halides. In U.S. Pat. No. 5,271,918, a photoresist composition is disclosed wherein a relatively low molecular weight novolak resin is esterified with an o-quinone diazide sulfonyl halide. From 40 to 96 percent of the phenolic hydroxyl groups are condensed with the o-quinone diazide sulfonyl group. In U.S. Pat. No. 5,529,880, there is disclosed a photoresist composition comprising a novolak resin having phenolic hydroxyl groups condensed with an o-quinone diazide sulfonyl halide and an additional photoactive component that is the esterification product of an o-quinone diazide sulfonyl halide with a high molecular weight phenol having from 2 to 5 aryl groups and at least 4 hydroxyl groups with at least 50 percent of the phenolic hydroxyl groups condensed with the o-quinone diazide sulfonyl group.

Each of the patents discussed above is incorporated herein by reference for disclosure of novolak resin compositions, modifications of novolak resins and the use of such resins in photoresist compositions. For purposes of the invention described herein, the term "phenolic resin" means any phenolic resin used in the manufacture of photoresist inclusive of those phenolic resins formed from phenol and those phenolic resins modified in any way such as in accordance with the patents described above.

In processes for the manufacture of phenolic resins having pendant hydroxyl group esterified with an acid halide, such as described above, the monomers are reacted together to form the resin, the resin is typically precipitated in water and removed from the reaction mixture by filtration and then condensed with the acid halide in the presence of a base catalyst. The process results in the formation of salts formed from acid residues and the base catalyst. It is known that both the acid condensation of the components to form the phenolic resin and the further reaction to condense pendant phenolic hydroxyl groups with acid halides results in a phenolic resin containing high levels of acid salts formed by reaction with the base catalyst. It is further known in the art that such acid salts are unacceptable contaminants in photoresists used for high resolution imaging such as in the fabrication of integrated circuit devices.

Efforts to remove dissolved contaminants from materials used for the formation of photoresists by water washing and ion exchange are known in the art. For example, one such method is disclosed in International Publication No. WO 93/12152 directed to removing metal ions such as sodium and iron from novolak resins during their manufacture. The process comprises cation exchange treatment whereby a cation exchange resin is first washed with a mineral acid solution to reduce the level of total sodium and iron ions in the exchange resin to preferably less than 100 ppb, passing a formaldehyde reactant through the so treated cation exchange resin to decrease the sodium and iron ion content to less than 40 ppb, passing a phenolic compound through the cation exchange resin to decrease its sodium and iron ion content to less than 30 ppb, and then condensing the so treated phenolic compound with formaldehyde in the presence of an acid catalyst to form the resin. Other processes for removing contaminants from photoresist components are shown in U.S. Pat. Nos. 5,443,736; 5,472,616; 5,500,127; 5,518,628; 5,525,315; and 5,571,657. Each cited patent is incorporated herein by reference for disclosure of ion exchange procedures.

Though washing with water and ion exchange have been used to remove contaminants from photoresist materials in the prior art, it has been found that conventional procedures such as those described above are unsatisfactory for removing contaminants from phenolic resins containing acid salts of a base catalyst. Without wishing to be found by theory, it is believed that the higher molecular weight resins entrap the salts formed by the condensation reaction and prevent their removal by filtration, water washing or conventional ion exchange procedures.

SUMMARY OF THE INVENTION

The present invention is directed to removal of acid salts from a solution of a phenolic resin having entrapped acid salts of a base catalyst, especially those phenolic resins having pendant hydroxyl groups condensed with an acid halide. The process comprises contact of a solution of the resin containing the acid salt contaminant with a strong acid cation exchange resin and with a base anion exchange resin which may be weak or strong. The contact of the polymer with the strong acid cation exchange resin causes exchange between the strong acid of the ion exchange resin and the acid portion of the salt thus scavenging the base from the polymer solution while introducing liberated strong acid into the solution. Contact of the polymer solution with the base anion exchange resin scavenges the liberated acid from the solution. The procedures of the invention provides a polymer having an acid salt content below detection limits.

The process of the invention may be used to treat any phenolic polymer having entrapped acid salts of a base catalyst, especially those resins having a pendant hydroxyl group condensed with an acid halide. Consequently, any phenolic polymer, inclusive of those described above having a portion of its phenolic hydroxyl groups condensed with an acid halide, may be treated by the process of the invention. The polymer so treated may be used for photoresist manufacture or any other purpose where high purity is a requirement.

DESCRIPTION OF THE PREFERRED EMBODIMENTS

As stated above, the invention is directed to purification of a phenolic polymer containing entrapped acid salt of a base catalyst. The inventions is especially useful for treatment of those phenolic resins having one or more phenolic hydroxyl groups condensed with an acid halide. The portion of hydroxyl groups condensed with the acid halide may vary within wide limits. In this respect, this portion may vary between 1 and 100 mole percent of the total of the hydroxyl groups on the resin but preferably varies between 5 and 50 mole percent and more preferably between 5 and 30 mole percent.

One class of phenolic resins suitable for treatment in accordance with the subject invention are novolak resins condensed with an o-quinone diazide sulfonyl halide to make a light sensitive resin. An early patent showing this resin is U.S. Pat. No. 3,046,120, granted Jul. 24, 1962, where an o-cresol formaldehyde resin is esterified with a naphthoquinone-(1,2)-diazide-(2)-5-sulfonyl chloride. The resulting product was used for fabrication of printing plates. Additional efforts to combine a photoactive compound with a phenolic resin are reported in U.S. Pat. Nos. 3,635,709; 4,123,279; and 4,306,011, each incorporated herein by reference. More recent attempts to condense novolak resins with the o-quinone diazide sulfonyl halide involve the use of the so called "aromatic novolak resins" which have been defined as a resin formed by condensing a phenol with a functional aromatic reactant capable of reacting with said phenol such as an aromatic aldehyde, a bis-hydroxymethylated phenol, or the combination of an aromatic aldehyde and a bis-hydroxymethylated phenol to form a novolak resin. The term also includes within its scope aromatic novolak resins further reacted with an additional aldehyde or a functional aromatic reactant alone or in combination with additional phenols to form alternating or block copolymers.

Formation of aromatic novolak resins by reaction of a phenol with an aromatic aldehyde is disclosed in U.S. Pat. No. 5,216,111 incorporated herein by reference. In accordance with the procedure of that patent, the aromatic novolak resins are acid catalyzed condensation products of one or more phenols and an aromatic aldehyde formed by the condensation of the reactants in the presence of an acid optionally in the presence of a divalent sulfur compound as a co-catalyst under reaction conditions set forth in the above-referenced patent. The phenol is of the type conventionally used in the formation of novolak resins, such as, for example, phenol itself, the cresols, xylenols, resorcinols, naphthol, bisphenols such as 4,4'-isopropylidenediphenol and mixtures of such phenols. An alternative method for formation of an aromatic novolak resin comprises reaction of a reactive phenol with a bis-hydroxymethyl phenol in accordance with the procedures set forth in U.S. Pat. No. 5,238,776 incorporated herein by reference. The procedure may be conducted in the absence of an aldehyde or in the presence of an aldehyde such as an aromatic aldehyde.

One use for the above described aromatic novolak resins is for formation of light sensitive components by condensation with an o-quinonediazide sulfonyl compound and such condensation products are products that may be treated in accordance with this invention. A phenolic resin esterified with an o-quinone diazide sulfonyl halide may be prepared by reaction of the phenolic with an o-quinone diazide sulfonyl halide represented by the formula:

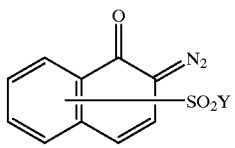

where Y represents a halogen group. The $SO_2Y$ group is typically bonded at the −4 or −5 position. The o-quinone diazide sulfonyl halide is reacted in an amount of from 1 to 50 mole percent, preferably in an amount of from 5 to 15 mole percent based upon the theoretical molar level of hydroxyl groups in the resin. The condensation of the phenolic resin with the o-quinone diazide sulfonyl halide is performed in organic solvents and in the presence of a base such as triethylamine, sodium carbonate, pyridine or the like. The condensation reaction proceeds at a relatively low temperature such as room temperature or below to about 45° C.

Additional polymers suitable for treatment in accordance with the procedures of this invention conform to the following formulae:

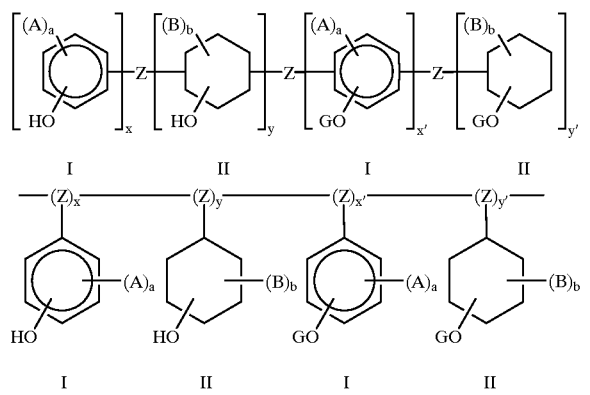

where each unit (I) represents a phenolic unit and unit (II) represents a cyclic alcohol unit; Z is an alkylene bridge having from 1 to 6 carbon atoms; A is a substituent on the aromatic ring replacing hydrogen such as lower alkyl having from 1 to 6 carbon atoms, halo such as chloro or bromo, alkoxy having from 1 to 3 carbon atoms, hydroxyl, nitro, amino, etc.; a is a number varying from 0 to 4; B is a substituent, such as hydrogen, lower alkyl having from 1 to 3 carbon atoms, halo such as chloro or bromo, alkoxy having from 1 to 3 carbon atoms, hydroxyl, nitro, amino, etc. provided that at least 3 of said B substituents are hydrogen; b is an integer varying between 6 and 10; —OG is an inert blocking group formed from the phenolic hydroxyl group, x is the mole fraction of the units (I) in the polymer which varies between 0.50 and 0.99 and preferably varies between 0.70 and 0.90 and y is the mole fraction of units (II) in the polymer and varies between 0.01 and 0.50 and preferably between 0.10 and 0.30 and x' and y' represent the mole fraction of the units having the inert blocking group and each varies between 0.01 and 0.20 where the total of x' and y' does not exceed 0.20 and preferably varies between 0.02 and 0.10. Any blocking group inert to generated acid or base at the elevated temperatures used to bake a photoresist and which does not interfere with the photolithographic reaction is suitable. Typical examples of suitable blocking groups include alkoxy groups such as methoxy, ethoxy, propoxy, n-butoxy, sec-butoxy, t-butoxy, etc.; alkyl esters represented by RCOO—wherein R is preferably an alkyl group having 1–4 carbon atoms such as methyl, ethyl, propyl, isopropyl and butyl, sec-butyl, t-butyl, etc.; a sulfonyl acid ester such as methanesulfonyl, ethanesulfonyl, propanessulfonyl, benzenesulfonyl and toluene-sulfonyl esters, etc. With respect to the above formulae, it should be understood that the invention is also applicable to novolak polymers and poly(vinylphenol)s that are not copolymers with cyclohexanol units. In this embodiment, y and y' would be 0.

The above resins are prepared by alkaline mediated condensation of an acid halide with a preformed copolymer to form the blocking group. A variety of bases may be employed for the condensation reaction including tertiary aliphatic amines, pyridine, pyridine derivatives, guanidine and guanidine derivatives, alkali metal hydroxides, alkali metal carbonates, etc. The percentage substitution of the polymer binder with the blocking group can be controlled by the amount of the blocking group precursor condensed with the polymer. The blocking group adds predominantly to the more reactive phenolic hydroxyl groups of the structure rather than to the cyclic alcohol groups of the above-depicted polymer binder. It is believed that blocking groups could add to both the phenolic and the cyclic alcohol groups of the binder by use of a stronger base such as an alkyl lithium reagents. The polymers having the above structure are generally used in an acid or base hardening photoresist system comprising as additional ingredients, an acid or base generator and a cross-linking agent. The acid generator compound used in the combination may be chosen from a wide variety of compounds known to form acid or base upon exposure to activating radiation.

In accordance with the subject invention, the resin solution containing the salt contaminants is treated with the combination of a strong acid cation exchange resin and a base anion exchange resin. The two ion exchange resins may be mixed for a single treatment step or may be used sequentially.

As is known in the art, strong acid cation exchange resins typically have sulfonic acid groups (—$SO_3H$) attached to an insoluble polymer matrix. When the functional groups are in the hydrogen form and the resin is in contact with a liquid containing other cations, hydrogen ions leave the cation exchange resin and enter into the liquid phase as they are replaced by cations from the liquid phase. Strong anion exchange resins typically have quaternary ammonium groups as the functional exchange sites. These resins are most frequently in hydroxide form for acid reduction. Hydrogen ions released by the resin as cations are absorbed from the liquid phase. The effect is elimination of acidity in the liquid and conversion of the resin to a salt form. Weaker base anion exchange resins, also suitable for purposes of the invention, typically have primary, secondary or tertiary amines as the functional group. The tertiary amine is most common. Weak base resins are frequently preferred over strong based resins for removal of strong acids to take advantage of greater ease in regeneration.

Most strong acid cation exchange resins are made from styrene-divinyl benzene copolymers though other polymers such as phenolics have been used for specialty purposes. The sulfonic acid groups are typically bonded to the aromatic rings throughout a resin particle. Strong base anion exchange resins are typically based upon copolymers of styrene and divinyl benzene which have been chloromethylated and then aminated. The aminated resin is then used to form a quaternary ammonium functional group. Weak base anion exchange resins are also formed from styrene-divinyl benzene copolymers which are chloromethylated and aminated in a two-step process. Chloromethyl groups are attached to the aromatic rings by reaction of a compound such as chloromethyl ether with the copolymer in the presence of a Friedel-Crafts catalyst such as aluminum chloride. Functionalization is completed by aminating the chloromethylated copolymer with either a primary or secondary amine.

Ion exchange resins of the type described above are well known in the art and described in numerous publications including Kirk-Othmer, Encyclopedia of Chemical Technology, Volume 14, (Fourth Edition), 1995, pp. 737–783, especially pp. 737–749, incorporated herein by reference for their teaching of typical cation and anion exchange resins. The cation exchange resin selected should be in the form of an acid and not a salt of the acid to avoid introduction of metal ions into the solution of the material to be treated.

Exemplary strongly acid cation exchange resins include the styrene-divinyl benzene sulfonic acid resins such as the Amberlyst 15, Amberjet 200H, Amberlite IRN77, Diaion SAN1, Dowex 50WX2, Dowex 50WX4 and Dowex 50WX8 resins. Suitable strongly basic exchange resins include the styrene-divinyl benzene resins having amine substitution such as the Dowex SBR, Dowex N-196, Amberlite IRA-400(OH). Amberlyst A260H and Amberlite IRN-78 resins. Suitably weakly basic exchange resins include Amberlite IRA42, Amberlite IRA-96, Diaion WA21J, Diaion WA30, Dowex WBR-2, Dowex N-283, Dowex 66 MWA-1 and Duolite A378 resins. Prepackaged mixed resins are also suitable. Such materials include Amberlite IRN-150, Diaion SMNup and Dowex MR-3 resins. Other ion exchange resins suitable for purposes of the invention would be obvious in view of the foregoing. Preferred acid cation exchange resins and base anion exchange resins are exemplified in the examples that follow.

Organic resin solutions may be processed by passing the solution of the resin through a column containing a mixture of the cationic and anionic exchange resins or through separate columns in sequence. The order of sequence is not critical though it is preferred that the cationic exchange resin be used prior to the anion exchange resin. Alternatively, the resin solution may be slurried with a mixture of the ion exchange resins or with separate beds of the resin.

The resin solution treated should be of relatively low viscosity. In this respect, it is preferred that the resin solution have a viscosity not exceeding 10 centipoise. Accordingly, the concentration of the resin in solution is such that the viscosity does not exceed the 10 centipoise limit. In general, the resin solution may contain the resin in concentrations ranging between 1 and 50 weight weight percent and more preferably, between 10 and 40 weight weight percent.

For maximum efficiency, it is desired that the moles of acid fixed on the cation exchange resin be equal to at least the stoichiometric amount required to neutralize the base fixed on the anion exchange resin. Preferably, the ratio of the cation exchange resin to the anion exchange resin is such that the moles of acid on the cation exchange resin is from 0.1 to 2 times the number of moles of base on the anion exchange resin required to neutralize the same. The total weight of the combined cation and anion exchange resins used to treat the resin solution should be at least 5 times the weight of the base used to catalyze the esterification reaction between the hydroxyl group on the phenol and the acid halide with which it is reacted.

In a batch process, contact time between the exchange materials with the resin solution may vary between about 1 and 30 hours and more preferably, from about 1 to 10 hours with each of the exchange resins. If the exchange resins are combined, then the contact time set forth above is suitable for the combined resin. The rate of passage of the resin solution through a column of the exchange resins may vary from about 2 to 20 bed volumes per hour.

The resin solution may be contacted with the exchange resins at room temperature but elevated temperatures are preferred as it has been found that increased temperature improves efficiency. Accordingly, the resin solution may vary in temperature between 10 and 75° C. and more preferably, between 20 and 40° C.

The invention will be better understood by reference to the examples that follow.

EXAMPLE 1

This example represents formation of an aromatic novolak resin and condensation of the so formed resin with a naphthoquinone diazide sulfonyl chloride.

Resin Preparation—A mixture of 778.6 grams of m-cresol, 453.1 grams of benzaldehyde, 357.8 grams of salicylaldehyde, 14.5 grams of 3-mercaptopropionic acid, 9.6 grams of p-toluenesulfonic acid monohydrate and 650 ml of propionic acid were charged into a 4-liter reaction vessel equipped with a paddle stirrer, reflux condenser and a nitrogen inlet tube. The mixture was heated to reflux and maintained at reflux for 4 hours. The more volatile components in the reaction mixture were then removed by distillation at ambient pressure under a constant flow of nitrogen. The mixture temperature was then raised and maintained between 141° and 145° C. and allowed to reflux for 1 hour to complete the reaction. Upon dilution with 1.6 liters of propionic acid, the resin solution was precipitated into 14 liters of deionized water. The product was collected on a filter, slurried in 14 liters of deionized water, collected by filtration, rinsed with deionized water and dried at 110° to 115° C. About 1,485 grams of a brown powder having a weight average molecular weight of 1,790 Daltons and a polydispersity of 1.95 was obtained having a glass transition temperature of about 177° C.

EXAMPLE 2

This example represents an alternative procedure for formation of an aromatic novolak resin and condensation of the so formed resin with a naphthoquinone diazide sulfonyl chloride.

Resin Preparation—A mixture of 194.8 grams of m-cresol, 113.4 grams of benzaldehyde, 89.5 grams of salicylaldehyde, 1.0 liter of ethanol and 0.1 liters of concentrated hydrochloric acid were charged into a 2 liter 3-necked round bottom flask equipped with a mechanical stirrer, heating mantle, reflux condenser and a nitrogen inlet tube. The mixture was heated to and kept at reflux for about 24 hours. The reaction mixture was transferred to an addition funnel and slowly added into 6 liters of deionized water to precipitate the product. After a 4-hour soak, the precipitate was collected on a Buchner funnel aided by reduced pressure. The product was rinsed, re-slurried into 6 liters of deionized water and after a 1-hour soak, was again collected on the Buchner filter and rinsed. The resin was partially air dried to remove the bulk of the water and further dried under vacuum at 65 to 68° C. The yield was about 360.4 grams of powder having a glass transition temperature of about 158° C. and a weight average molecular weight of about 1823 Daltons.

EXAMPLE 3

This example illustrates mesylation of a preformed poly (vinylphenol) resin and ion exchange treatment of the reaction product.

In a 2 L three-necked flask, 795 ml of acetone and 250.0 g of poly(vinylphenol) (MARUKA LYNCUR M grade; purchased from Maruzen Petrochemical Co., LTD) were mixed at 25° C. until dissolution was achieved. Thereafter, 45.3 grams of methane sulfonylchloride were added followed by the dropwise addition, over 30 minutes, of a solution comprising of 44.0 g triethylamine and 85 ml acetone. During the base addition the batch temperature rose to 30° C. and was held at this temperature for 1 hour and 15 minutes. To this reaction mixture was then added 307 g of Amberlite IRN 77, 242 g of reaction mixture was then added 307 g of Amberlite IRN 77, 242 g of Dowex SBR OH and the mixture stirred while maintained at 30° C. Both ion exchange resins were thoroughly washed with demineralized water and de-watered with acetone before use. After a 1 hour and 30 minutes contact, the ion exchange resins were removed by filtration and the product precipitated into 3.5 L of de-mineralized water. The precipitate was collected on a filter, washed with de-mineralized water and dried under vacuum at 50° C. to give 253 g of polymer. Ion chromatography analysis showed the polymer to contain less than 1.0 ppm methane sulfonic acid and less than 5 ppm chloride.

EXAMPLE 4
Comparative Example

O-naphthoquinonediazide esterified Aromatic Aldehyde Novolak Resin prepared without the use of an ion exchange resin treatment.

To a 500 ml three-necked round bottom flask equipped with a water bath, stirrer and thermometer was added 350 ml of acetone, 50 g of aromatic aldehyde resin and 14.7 g of 1,2-naphthoquinone-(2)-diazide-5-sulfonyl chloride. The mixture was warmed to about 25° C. and a base solution comprising about 5.7 g triethylamine in 10 ml acetone was added within 5 minutes. The reaction mixture was then maintained at 36° C. for 2.5 hours to complete the esterification reaction. After this period, the excess base was neutralized with hydrochloric acid and the solution slowly added to 3 L of demineralized water to precipitate the product. The product was collected using a Buchner funnel assisted by a partial vacuum, rinsed with water and reslurried in 3 L of de-mineralized water. Again, the product was collected with the funnel, rinsed with water and partially air dried on the filter. Final drying was achieved at about 40° C. under vacuum. About 62 g of esterified aromatic resin was obtained. Ion chromatography (IC) analysis showed the esterified resin to contain 366 ppm o-naphthoquinonediazide sulfonic acid and 1440 ppm chloride.

EXAMPLE 5

This example demonstrates the use of a weak base, strong acid mixed bed ion exchange column to remove chloride ions.

The reaction of Example 4 was essentially repeated except that the reaction mixture was passed through a weak base-strong acid mixed bed ion exchange column before the product was precipitated into de-mineralized water. The column employed was a one inch glass column packed with a mixture of 75 g of Duolite 368 and 75 g of Amberlite IRN 77 ion exchange resins. Before use, the packed column was washed with de-mineralized water followed by an acetone wash. 205 ml of the reaction mixture was passed through the column in 25 minutes. 20 ml aliquot of the exchanged solution was slowly added to 120 ml of de-mineralized water to precipitate the polymer. The product sample was collected on a filter, washed and dried. IC analysis showed the presence of 28 ppm chloride ion. The remainder of the ion exchanged reaction solution was again passed through the column and a 20 ml aliquot was withdrawn and added to 120 ml de-mineralized water. After the precipitate was collected, washed and dried IC analysis showed the chloride ion concentration at 6 ppm.

EXAMPLE 6

This example demonstrates the use of a strong base-strong acid mixed bed ion exchange column to remove chloride ions.

The reaction of Example 4 was essentially repeated except that the reaction mixture was passed through a strong base-strong acid mixed bed ion exchange column before the product was precipitated into de-mineralized water. The column employed was a one inch glass column packed with a mixture of 75 g of Dowex SBR OH and 75 g of Amberlite IRN 77 ion exchange resins. Before use, the packed column was washed with de-mineralized water followed by an acetone wash. 205 ml of the reaction mixture was passed through the column in 20 minutes. 20 ml aliquot of the exchanged solution was slowly added to 120 ml of de-mineralized water to precipitate the polymer. The product sample was collected on a filter, washed and dried. IC analysis showed the presence of 3 ppm chloride ion. The remainder of the ion exchanged reaction solution was again passed through the column and a 20 ml aliquot was withdrawn and added to 120 ml de-mineralized water. After the precipitate was collected, washed and dried IC analysis showed the chloride ion concentration at 3 ppm. This demonstrates that the use of a strong base ion exchange resin is more efficient in removing the chloride contamination than when a weak base in used in the process.

EXAMPLE 7

The following example demonstrates use of the mixed bed ion exchange process in a batch or slurry mode.

To a 500 ml three-necked round bottom flask equipped with a water bath, stirrer and thermometer was added 150 ml of acetone, 75 g of aromatic aldehyde resin prepared according to example 4 and 20.3 g of 1,2-naphthoquinone-(2)-diazide-5-sulfonyl chloride. The mixture was warmed up to about 25° C. and a base solution comprising about 8.55 g triethylamine in 30 ml acetone was added dropwise within 6 minutes. The reaction mixture was then maintained at 30° C. for one hour. 59 Grams of Amberlite IRN 77 and 51 g of Dowex SBR OH, previously water and acetone washed, are added and the mixture gently stirred at 30° C. for two hours. The ion exchange resins are removed by filtration. The exchanged reaction mixture was then added dropwise to 2.5 L of de-mineralized water. The precipitated product was collected using a Buchner funnel and spread on a tray and vacuum dried at 40° C. IC analysis showed the esterified resin to contain 16 ppm o-naphthoquinonediazide sulfonic acid and 3 ppm chloride.

EXAMPLES 8–13

The following examples demonstrate that some ion exchange resin combinations are much more efficient at removing the ions in questions. The procedure of Example 7 was repeated for the ion exchange mixtures.

| Example | Exchange resins, g | Resin Type | Chloride, ppm | Sulfonic Acid, ppm |
|---|---|---|---|---|
| 8 | Amberlite IR-120-Plus, 60 | Strong Acid | 13 | 5 |
|  | Amberlite IRA-400 OH, 51 | Strong Base |  |  |
| 9 | Amberlite IR-120-Plus, 60 | Strong Acid | 89 | 154 |
|  | Dowex XUS-40283, 51 | Weak Base |  |  |
| 10 | Diaion WK-100, 60 | Weak Acid | 2657 | 1633 |
|  | Dowex XUS-40283, 50 | Weak Base |  |  |
| 11 | Diaion WK-100, 42 dry | Weak Acid | 451 | 204 |
|  | Amberlite IRA-400 OH, 51 | Strong Base |  |  |
| 12 | Amberlite IRN-150, 100 (Mixed Bed) | Strong Acid Strong Base | 2 | <5 |
| 13 | Amberlite MB-1, 50 (Mixed Bed) | Strong Acid Strong Base | 14 | <10 |

The table illustrates that a strong acid exchange resin is required to obtain a sufficiently low chloride and acid content.

What is claimed is:

1. A process for removing salts formed from acid residues and a base catalyst from a phenolic resin, said process comprising the steps of providing a solution of a phenolic resin having a portion of its hydroxyl groups condensed with an acid halide in the presence of a base catalyst said phenolic resin containing entrapped salts formed by said condensation, and contacting said solution with a strong acid cation exchange resin and a strong base anion exchange resin for a time sufficient to remove essentially all of said entrapped acid salt contaminants.

2. The process of claim 1 where the process is conducted at a temperature whereby the solution has a viscosity that does not exceed 10 centipoise at the temperature at which the process is conducted and the base anion exchange resin is a quaternary ammonium hydroxide exchange resin.

3. The process of claim 2 where the ratio of the cation exchange resin to the anion exchange resin is such that the moles of acid on the cation exchange resin to the moles of bases on the anion exchange resin varies from stoichiometric equivalency to 2 times stoichiometric equivalency.

4. The process of claim 2 where the phenolic resin is the condensation product of the hydroxyl groups of a phenolic resin with an o-quinone diazide sulfonyl halide.

5. The process of claim 4 where the o-quinone diazide sulfonyl halide conforms to the formula:

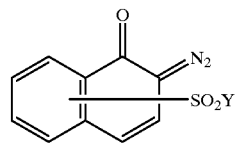

where Y represents a halogen group.

6. The process of claim 2 where the phenolic resin is a polyvinyl phenol resin.

7. The process of claim 2 where the phenolic resin is a novolak resin.

8. The process of claim 7 where the novolak resin is a novolak resin formed from a phenol and an aromatic aldehyde.

9. The process of claim 2 where the weight of the total of the exchange resins is at least 5 times the weight of the base used to catalyze the condensation reaction.

10. The process of claim 1 where the process is conducted at a temperature of from 10 to 75° C.

11. The process of claim 10 where the concentration of the resin in solution varies between 1 and 50 percent by weight.

12. The process of claim 11 where the concentration varies between 10 and 40 percent by weight.

13. The method of claim 1 where the phenolic hydroxy groups condensed with the acid halide form a group inert to photogenerated acid or base.

14. The method of claim 13 where the inert group is a member selected from the group consisting of alkoxy, alkyl ester having 1 to 4 carbon atoms, and sulfonyl esters.

15. A process for removing salts formed from acid residues and a base catalyst from a phenolic resin, said process comprising the steps of providing an organic solution of a phenolic resin having a portion of its phenolic hydroxyl groups condensed with an acid halide in the presence of a base catalyst said phenolic resin containing entrapped salts formed by said condensation, and said organic solution having a viscosity that does not exceed 10 centipoise at the temperature at which the process is conducted and a concentration in solution of from 1 to 50 percent by weight, and contacting said solution with a strong acid cation exchange resin and a strong base quaternary ammonium hydroxide anion exchange resin at a temperature of from 10 to 75° C. for a time sufficient to remove essentially all of said acid salt contaminants.

16. The process of claim 15 where the phenolic resin is an aromatic novolak resin having a portion of its hydroxyl groups esterified with an o-quinone diazide sulfonyl halide.

17. The process of claim 15 where the concentration of the phenolic resin in solution varies between 10 and 40 percent by weight.

18. The process of claim 15 where the ratio of the cation exchange resin to the anion exchange resin is such that the moles of acid on the cation exchange resin to the moles of bases on the anion exchange resin varies from stoichiometric equivalency to 2 times stoichiometric equivalency.

19. The process of claim 15 where the weight of the total of the exchange resins is at least 5 times the weight of the base used to catalyze the condensation reaction.

20. The process of claim 15 where the o-quinone diazide sulfonyl halide is an o-naphthoquinone diazide sulfonyl chloride.

21. The method of claim 15 where the phenolic hydroxy groups condensed with the acid halide form a group inert to photogenerated acid or base.

22. The method of claim 21 where the inert group is a member selected from the group consisting of alkoxy, alkyl ester having 1 to 4 carbon atoms, and sulfonyl esters.

* * * * *